(12) United States Patent
Chao et al.

(10) Patent No.: US 7,164,285 B1
(45) Date of Patent: Jan. 16, 2007

(54) DIRECTIONAL POWER DETECTION BY QUADRATURE SAMPLING

(75) Inventors: Yen-Fang Chao, Pleasanton, CA (US); Cuong Nguyen, San Jose, CA (US); Roland Matian, San Jose, CA (US)

(73) Assignee: Stratex Networks, Inc., San Jose, CA (US)

( * ) Notice: Subject to any disclaimer, the term of this patent is extended or adjusted under 35 U.S.C. 154(b) by 0 days.

(21) Appl. No.: 11/222,560

(22) Filed: Sep. 8, 2005

Related U.S. Application Data

(60) Provisional application No. 60/707,671, filed on Aug. 12, 2005.

(51) Int. Cl.
*G01R 31/36* (2006.01)
(52) U.S. Cl. ............... 324/771; 333/248; 455/126; 324/95
(58) Field of Classification Search ............ 324/95; 333/248; 455/126
See application file for complete search history.

(56) References Cited

U.S. PATENT DOCUMENTS

| 4,019,150 A | 4/1977 | Lurey et al. |
| 4,736,170 A * | 4/1988 | Wu et al. ............ 332/103 |
| 4,870,376 A * | 9/1989 | Wagers ............... 333/150 |
| 4,983,981 A | 1/1991 | Feldman |
| 5,081,713 A | 1/1992 | Miyazaki |
| 5,113,416 A | 5/1992 | Lindell |
| 5,126,686 A | 6/1992 | Tam |
| 5,126,688 A | 6/1992 | Nakanishi et al. |
| 5,126,698 A * | 6/1992 | Fischer et al. ......... 332/105 |
| 5,208,550 A | 5/1993 | Iwane |
| 5,214,393 A | 5/1993 | Aihara |
| 5,335,369 A | 8/1994 | Aisaka |
| 5,371,473 A | 12/1994 | Trinh et al. |
| 5,515,008 A | 5/1996 | Ueda et al. |
| 5,640,691 A | 6/1997 | Davis et al. |
| 5,832,373 A | 11/1998 | Nakanishi et al. |
| 6,002,922 A | 12/1999 | Schwent |
| 6,038,432 A | 3/2000 | Onoda |
| 6,121,925 A | 9/2000 | Hilliard |
| 6,128,477 A | 10/2000 | Freed |
| 6,137,377 A * | 10/2000 | Wallace et al. ......... 333/139 |
| 6,320,913 B1 | 11/2001 | Nakayama |
| 6,397,090 B1 | 5/2002 | Cho |
| 6,615,028 B1 | 9/2003 | Loke et al. |
| 6,678,506 B1 | 1/2004 | Dolman et al. |

OTHER PUBLICATIONS

International Search Report for PCT/US04/05370, Sep. 23, 2004.

* cited by examiner

*Primary Examiner*—Jermele Hollington
*Assistant Examiner*—Arleen M. Vazquez
(74) *Attorney, Agent, or Firm*—Leah Sherry; Brown Raysman Millstein Felder & Steiner LLP

(57) ABSTRACT

Power measurement and control in transmission systems are affected by changes in load conditions. A method and system are provided for detecting and controlling power levels independent of such load conditions.

27 Claims, 3 Drawing Sheets

FIG. 1- *Single Probe (Prior Art)*
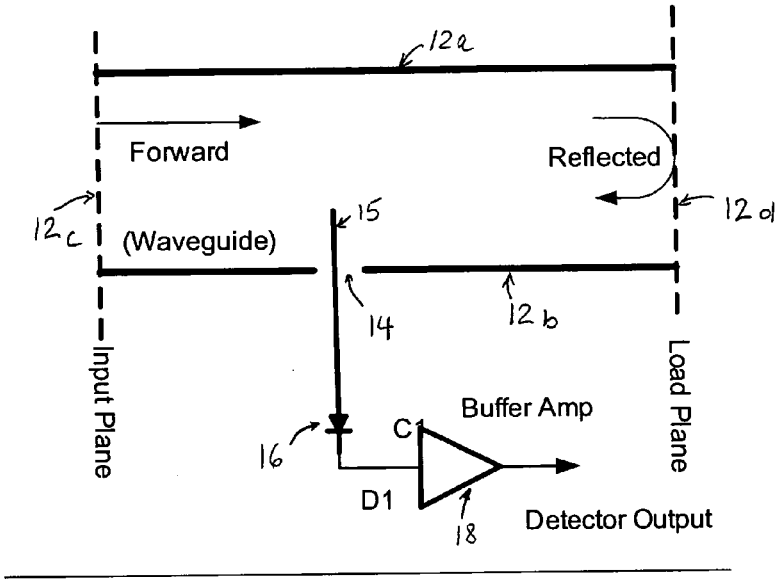
FIG. 2 –Directional *Waveguide Coupler (Prior Art)*
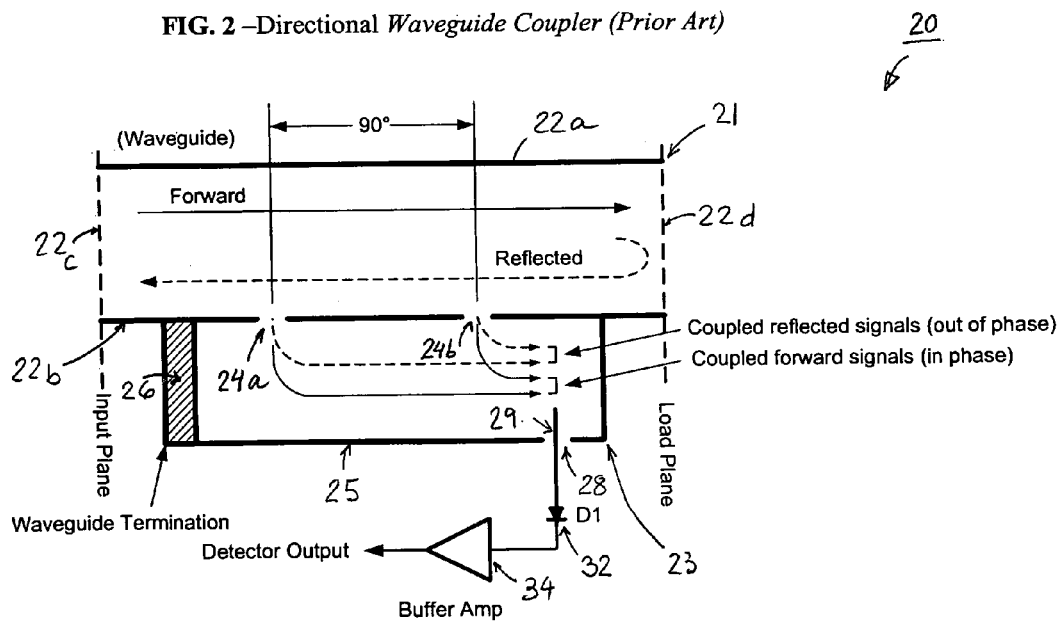

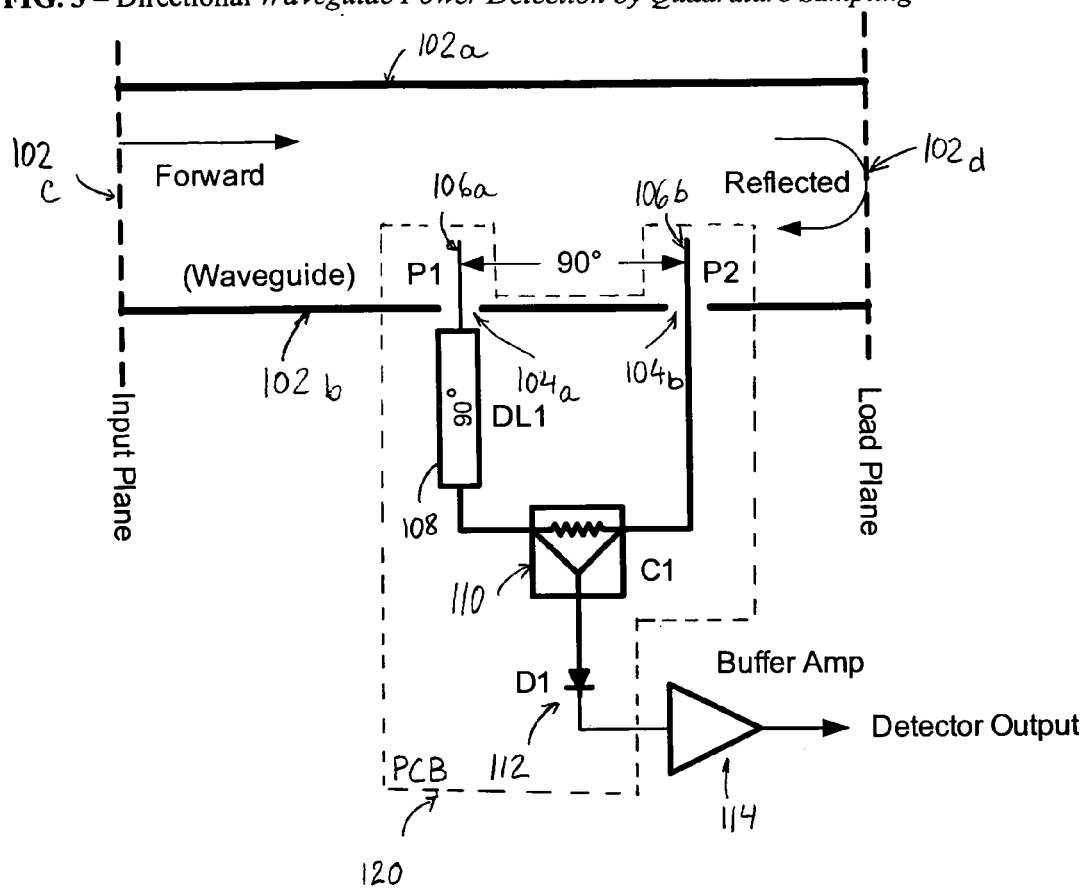
FIG. 3 – Directional *Waveguide Power Detection by Quadrature Sampling*

US 7,164,285 B1

DIRECTIONAL POWER DETECTION BY QUADRATURE SAMPLING

REFERENCE TO EARLIER FILED APPLICATION

This application claims the benefit of and incorporates by reference U.S. Provisional Application Ser. No. 60/707,671, filed Aug. 12, 2005, and entitled "DIRECTIONAL POWER DETECTION BY QUADRATURE SAMPLING".

INTRODUCTION

Field of the Invention

The present invention relates to signal transmissions and, in particular, to measurement and control of signal transmission power.

BACKGROUND

In order to have power measurement and control, transmitters are configured with power control feedback loops responsive to power detectors. In common configurations for high (e.g., microwave) frequency bands, the power level is measured by a detector in a waveguide which is connected between the output of the power amplifier and the load.

In general, waveguides are used for transporting high frequency signals, in part because of their low-loss characteristics and ability to handle high power. Waveguide components are configured in a number of geometries, examples of which include 'parallel' with a pair of plates, 'co-planar' with a thin slot in the ground plane of one side of a dielectric substrate with or without a conductor in the slot, 'dielectric' with a dielectric ridge on a conductor substrate, 'ridge' with conducting ridges on the top and/or bottom walls, and 'rectangular' with a parallel-piped structure of a substantially rectangular cross section. Thus, although the discussion here examines rectangular waveguides, other waveguide may be suitable for power measurement.

One approach to power measurement can be described as the single probe approach, as shown in FIG. 1. The waveguide component is defined by its top, bottom, input and load planes, 12a–d, respectively. The waveguide has a single slot 14 in the bottom plane and a single probe 15 for measuring the power level protrudes into the waveguide through this slot 14. The probe 15 is often made of a conductive material and the potential generated thereby drives the detector diode 16. The output of the detector diode 16 is connected to a buffer amplifier 18 in order to isolate the detector diode from downstream components (not shown) and prevent their interference with its signal integrity.

As shown, forward signals traverse the waveguide from the input plane 12c to the load plane 12d. Ideally, there would be a perfect impedance match between the waveguide and the load (antenna or test equipment not shown) and the entire signal energy would be transferred from the waveguide to the load. In reality, however, the match is imperfect and results in reflections of the forward signals from the load plane 12d. The opposite-traveling reflected signals interfere with the forward signals and this produces a new wave pattern known as standing waves, which is what the probe 15 ultimately measures.

The amplitude of the standing waves is affected by the degree of interference of the reflected signals with the forward signals which is based on the degree of mismatch between the waveguide and the load. Then, because with the single probe configuration there is no isolation from the load mismatch, this measurement is strongly influenced by variations in the load conditions.

A second approach, described as a directional waveguide coupler, attempts to solve the problems associated with the unreliable power measurement inherent in the single probe configuration. FIG. 2 illustrates the directional waveguide coupler.

The directional waveguide 21 is designed for a particular frequency band with top, bottom, input and load planes 22a–d, respectively, and with the slots 24a and 24b in the bottom plane 22b spaced apart a quarter wavelength (or 90°). Attached to the bottom plane of the waveguide and facing the slots 24a and 24b is a coupler 23, also configured as a waveguide. The coupler 23 has a waveguide termination plate 26 and a bottom plate 25 with a slot 28 through which the power probe 29 protrudes. As before, the power probe 29 is connected to a detector diode 32 which is, in turn, connected to the buffer amplifier 34 to produce the detector output while isolating it from downstream stages.

Under ideal load conditions there would be a perfect match between the waveguide and the load (antenna or test equipment not shown), and the load plane 22d would transfer the forward signals from the waveguide to the load without losses. In reality, the load conditions are not perfect because of the load-waveguide impedance mismatch and the load plane 22d reflects the forward signals. The reflected waves interfere with the forward waves and whenever two waves of similar frequency travel in a medium in opposite directions standing waves are formed. Thus, the load plane acts as a constructive or destructive reflector based on its position relative to the resultant standing waves cycle. The same applies to the signals passing to the coupler through the slots 24a and 24b.

The forward signals that pass through slots 24a and 24b, respectively, converge at the probe 29 in phase. This is because the forward signals moving through the waveguide 21 and slot 24b and those moving through slot 24a and the coupler 23 travel the same respective quarter wavelength (90°) distance. At the same time, reflected signals which pass through slot 24a travel the quarter wavelength (90°) distance twice, once in the direction toward slot 24a and once in the opposite direction toward the probe 29. In other words, reflected signals that pass through slot 24a are 180° out of phase relative to the reflected signals that pass through slot 24b.

It is noted that a full cycle of the wave is comparable to a full circle of 360°, and any fraction of the circle in degrees is comparable to a fraction of the wave cycle which is the phase. When the forward and reflected signals are in phase (0° or 360° phase difference), the interference is constructive and produces a standing wave which is the sum of both (with twice the amplitude); and the interference is destructive when they are out of phase from each other. The phase shift (P) between the opposite-traveling waves can be 0<P<360°, where a 180° phase shift results in mutual cancellation of these waves.

Thus, the reflected signals converge at the probe 29 at 180° out of phase and cancel each other. Ideally, the probe 29 reads the magnified forward signals and none of the reflected signals. In reality, however, there is an imperfect match at the waveguide termination plate 26 and some of the reflected signals do end up converging at the probe with less or more than 180° phase shift.

The reason for this imperfection is any inaccuracy in the complex mechanical structure of the waveguide and coupler. Indeed, any variation in the operating frequency and/or the mechanical dimensions or material of the waveguide and coupler components can create a mismatch and, as a result, introduce some of the reflected waves at the probe 29. In particular, the frequency dependent waveguide termination plate design calls for different types of material to achieve the desired performance. Moreover, manufacture of the waveguide and coupler involves non-flexible frequency-dependent mechanical and electrical design for achieving performance such as isolation and power coupling. The two-part directional waveguide structure is hard to build and is even harder to replicate in commercial quantities.

SUMMARY

In view of the foregoing, the present invention proposes solutions that address this and related issues. These solutions include systems, devices and methods that are provided in accordance with the principles and various embodiments of the present invention.

As shown and broadly described herein, one embodiment is a device for power detection. This device includes a waveguide, a pair of probes, a quarter wavelength delay component, a power combiner, a detector diode and a carrier on which the pair of probes, quarter wavelength delay component, power combiner and detector diode are laid out. The waveguide is configured for transporting forward and reflected waves of a signal with a corresponding wavelength and a power level. For the purpose of power detection, the waveguide has a pair of slots spaced apart by a quarter of the wavelength. The pair of probes protrudes into the waveguide through the pair of slots for probing the signal and measuring its power level. The pair of probes, quarter wavelength delay component, power combiner and detector diode are laid out on the carrier in a configuration where the forward waves converge at the power combiner constructively and the reflected waves converge at the power combiner destructively. This way, the measured power level is substantially independent from load condition variations.

It is noted that the carrier is a printed circuit board or a substrate. The substrate can be integrated into an integrated circuit or any other suitable configuration for high frequency (particularly microwave) applications. In the case where the carrier is a substrate it may or may not be partially encapsulated but the circuit components that need to be exposed, such as the probes, are properly exposed to the waves.

Typically, the waveguide has top, bottom, input and load planes, wherein the pair of slots is located in the bottom plane such that one of the slots and, in turn, one of the probes, are closer to the input plane. In this case, the configuration is one in which the detector diode is connected to the power combiner for receiving a signal proportionate to the measured power level and in which the power combiner is connected to the pair of probes. One side of the power combiner is connected via the quarter wavelength delay component to the probe which is closer to the input plane.

Another device for power detection is configured with a pair of members and a detector circuit carrier. In particular, the pair of members is detachably joined to form a body with a duct, wherein the duct defines a waveguide for transporting forward and reflected waves of a signal with a corresponding wavelength and a power level. As before, the waveguide has a pair of slots spaced apart by a quarter of the wavelength. The detector circuit carrier is inserted between the joined pair of members and fits removably therebetween. The detector circuit carrier has a pair of probes, a quarter wavelength delay component, a power combiner, and a detector diode, wherein the pair of probes protrudes into the waveguide through the pair of slots for probing the signal and measuring its power level. Moreover, the pair of probes, quarter wavelength delay component, power combiner and detector diode are laid out on the detector circuit carrier in a configuration where the forward waves converge at the power combiner constructively and the reflected waves converge at the power combiner destructively, whereby the measured power level is substantially independent from load condition variations. Again, the detector circuit carrier is a printed circuit board or a substrate as explained above.

In yet another embodiment, a power detection and control loop in a transmission system includes a waveguide between an output stage and a load, a detector circuit for measuring the power level substantially at the load and a control circuit. The output stage produces a signal with a corresponding wavelength and power level, and the waveguide transports forward and reflected waves of the signal. Again, the waveguide has a pair of slots spaced apart by a quarter of the wavelength. The detector circuit is laid out on a circuit carrier and has a pair of probes, a quarter wavelength delay component, a power combiner, and a detector diode, wherein the pair of probes protrudes into the waveguide through the pair of slots for probing the signal and measuring its power level. The pair of probes, quarter wavelength delay component, power combiner and detector diode are laid out on the detector circuit carrier in a configuration where the forward waves converge at the power combiner constructively and the reflected waves converge at the power combiner destructively, whereby the power measurement is substantially independent from load condition variations. The control circuit has a buffer amplifier linked to stages responsive to the measured power level and operatively linked to the output stage for controlling its gain and, in turn, the power level of the signal. Incidentally, the load is an antenna or a dummy load in a test device and, as before, the circuit carrier is a printed circuit board or a substrate.

In accordance with yet another embodiment of the invention, a method for detecting power in a transmission system includes a number of steps. One step involves inserting a waveguide between an output stage and a load for transporting forward and reflected waves of a signal with a corresponding wavelength and a power level. For this method, as with the devices above, the waveguide has a pair of slots spaced apart by a quarter of the wavelength. Another step involves inserting, through the pair of slots, a pair of probes into the waveguide, the pair of probes being capable of probing the signal and measuring the power level. Another step is where a quarter wavelength delay component is introduced into a measured signal path between a first one of the pair of probes and one side of a power combiner, the other side of the power combiner being directly connected to the a second one of the pair of probes. Then, another step involves detecting a signal proportionate to the measured power level, the signal being detected by a diode which receives the signal from the power combiner. Once again, the pair of probes, the quarter wavelength delay component, the power combiner and the diode are laid out on a circuit carrier in a configuration where the forward waves converge at the power combiner constructively and the reflected waves converge at the power combiner destructively, whereby the measured power level is substantially independent from load condition variations.

In accordance with yet another embodiment, a method for detecting and controlling power in a transmission system includes the step of inserting a waveguide between an output stage and a load for transporting forward and reflected waves of a signal with a corresponding wavelength and a power level. As with the preceding embodiments, the waveguide has a pair of slots spaced apart by a quarter of the wavelength. This method further includes the step of inserting, through the pair of slots, a pair of probes into the waveguide. This is so that the pair of probes can probe the signal and measure the power level. This method additionally includes the step of introducing a quarter wavelength delay component into a measured signal path between a first one of the pair of probes and one side of a power combiner, the other side of the power combiner being directly connected to the a second one of the pair of probes. With this approach, a signal proportionate to the measured power level is detected. The signal is detected by a diode which receives the signal from the power combiner. In this instance, as in the others, the pair of probes, the quarter wavelength delay component, the power combiner and the diode are laid out on a circuit carrier, a printed circuit board or a substrate, in a configuration where the forward waves converge at the power combiner constructively and the reflected waves converge at the power combiner destructively. This way, the measured power level is substantially independent from load condition variations. The detected signal is fed to downstream stages that are operatively linked with the output stage to control its gain and, in turn, the power level in response to the measured power level.

One benefit derived from the present invention as broadly described herein is simplicity of implementation. Another benefit derived from the present invention is lower cost to manufacture for commercial applications. And, even with this simpler configuration, the present invention advantageously provides a more reliable power measurement and control. In sum, these and other features, aspects and advantages of the present invention will become better understood from the description herein, appended claims, and accompanying drawings as hereafter described.

BRIEF DESCRIPTION OF THE DRAWINGS

The accompanying drawings which are incorporated in and constitute a part of this specification illustrate various aspects of the invention and together with the description, serve to explain its principles. Wherever convenient, the same reference numbers will be used throughout the drawings to refer to the same or like elements. The drawings include:

FIG. 1 illustrates a conventional single probe configuration;

FIG. 2 illustrates a conventional directional waveguide coupler configuration;

FIG. 3 illustrates a directional waveguide power detector configured in accordance with an embodiment of the present invention.

DETAILED DESCRIPTION

Figure 4:
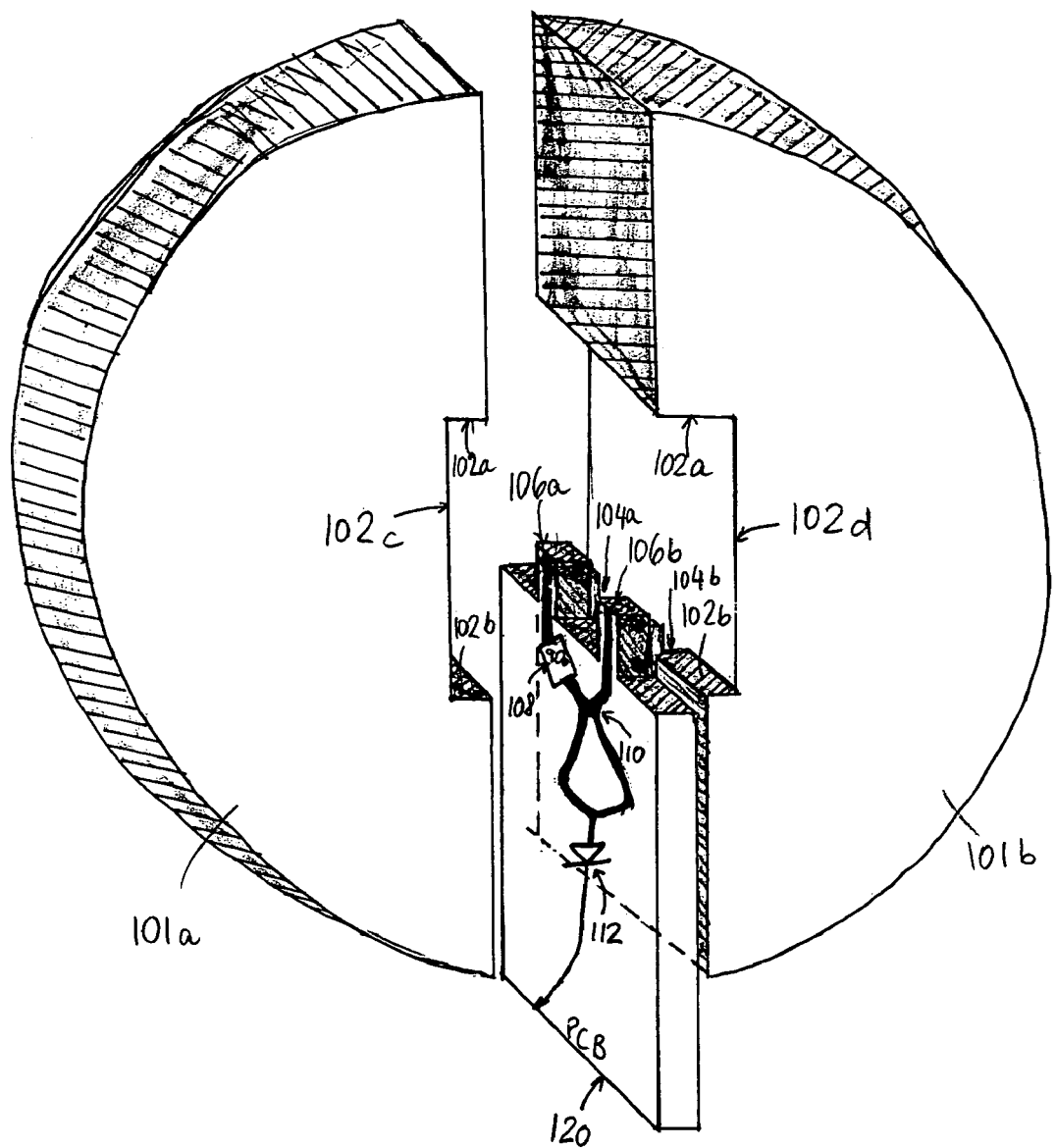
FIG. 4 is a perspective view of the directional waveguide of FIG. 3.

The present invention is based, in part, on the observation that transmitters of radio frequency signals are calibrated for particular load conditions. In a typical situation, a transmitter is calibrated with test equipment as the load and then used with an antenna as the load. The load conditions created by the test equipment are not necessarily exactly the same as the load conditions created by the antenna, and, moreover, different antennas have slightly different characteristics and may create different load conditions at the output of the transmitter. In some situations, the manufacturer may calibrate the transmitter with one kind of test equipment and a compliance verification laboratory may test the transmitter with another kind of test equipment (e.g., for FCC rules compliance). Transmitter load conditions may vary also with environmental changes such as temperatures and humidity variations. For this reason the present invention looked at ways to substantially overcome variations in load conditions and thereby improve power measurement and control in transmission systems. We will examine such ways with the examples that follow.

In general, because it recognizes that load conditions are imperfect and often result in standing waves produced from reflected signals interfering with forward signal, the present invention proposes to substantially cancel the effects of the reflected waves. Specifically, the present invention proposes to converge reflected waves which are out of phase at substantially 180° and thus cancel each other.

One approach for implementing this involves quadrature sampling in a directional waveguide. FIG. 3 illustrates a directional waveguide for power detection by quadrature sampling.

As shown, the power detection system 100 includes a directional waveguide defined by top, down, input and output planes, 102a–d, respectively. The bottom plane 102b has two slots 104a and 104b spaced apart a quarter wave distance (90°), based on the frequency band. Two probes 106a and 106b (labeled P1 and P2, respectively) protrude through the slots into the waveguide. The probes are therefore also spaced apart a quarter wave distance, or 90°. The physical dimensions of the waveguide and, in particular, the distance between the slots 104a and 104b depend on the frequency range of transmission. Thus, for instance, if the transmission frequency is 50 GHz and the bandwidth is 10% of the transmission frequency, i.e., +/−2.5 GHz, a quarter wavelength would be 1.5 mm.

In this configuration, the probes, P1 and P2, are passive devices such as conductors (traces) on a printed circuit board (PCB) 120. The PCB is shaped to allow passage of the two probes through the slots 104 a and 104b. Then, in addition to the probes, the PCB 120 holds detector circuit components such as a 90° delay line 108, a power combiner 110 and a detector diode 112. The power detector circuit on the PCB is formed with the probe P1 connected to one side of the power combiner via the 90° delay line and with the probe P2 connected to the other side of the power combiner. The detector diode 112 is connected across the power combiner 110 to receive a signal which represents the measured power. The power combiner in this circuit is a passive circuit such as a resistive connection that produces a voltage drop proportionate to the current induced from the power measured by the probes P1 and P2.

The buffer amplifier 114 and downstream stages (not shown) are located off the PCB 120. The buffer amplifier protects the detector diode from the effects of downstream stages in order to maintain the diode's signal integrity and reliably correlate the output of the diode with the measured power.

In operation, the forward signals are any type of transmitted signals at a particular frequency range, having a particular power level and being modulated if they carry any information. Un-modulated signals with a particular frequency do not contain any information and they are typically known as the carrier waves. Modulated signals carry information and they are created by various modulation techniques examples of which include AM (amplitude modulation), FM (frequency modulation), QAM (quadrature amplitude modulation), and PWM (pulse width modulation). The forward signals travel from the input plane 102c toward the output plane 102d and because of imperfect load conditions reflected signals travel in the opposite direction. Both forward and reflected signals are intercepted by the probes P1 and P2, which are located 90° apart, and converge at the power combiner.

As they travel through the waveguide, forward waves intercepted by probe P1 pass through the 90° delay line and thus incur a 90° delay. At the same time, forward signals intercepted by probe P2 pass directly to the power combiner, but they incur a 90° delay in reaching probe P2 because of the 90° distance between probe P1 and P2. In other words, because they are equally delayed by 90°, the forward signals intercepted by probes P1 and P2 converge at the power combiner in phase relative to each other. This means that the forward signals' convergence is constructive and the resulting signal is the sum of both.

By comparison, the reflected signals converge at the power combiner at opposite phases (180°) relative to each and their convergence is destructive. More specifically, reflected waves intercepted by probe P2 pass directly to the power combiner while reflected waves intercepted by probe P1 travel 180° before they reach the power combiner (90° distance to P1 and 90° delay at the delay line). Signals converging at 180° phase difference cancel each other. Therefore, the destructive convergence of the reflected signals results in them canceling each other and not affecting the power measurement. In other words, the measured power as presented by the voltage across the power combiner is substantially free from load condition variations. The measured power is then reliably detected by the detector diode 112 and the value is passed along via the buffer amplifier 114 to downstream stages (of the power control loop).

It is noted that the frequency range is scalable to other, higher frequencies simply with changes to the PCB layout design and changes to the waveguide dimensions and distance between the slots. In essence, there would be one set of dimensions for each frequency, but the fundamental design is similar for the various frequencies. The ease with which a PCB can be designed and made is one advantage of the present invention.

It is further noted that the depth of insertion of the probes into the waveguide controls the sensitivity of the detector circuit (i.e., the power level detection voltage at the power combiner). Hence, the ease with which the PCB can be adjusted to achieve the proper depth of protrusion into the waveguide is yet another advantage of the present invention. Furthermore, the PCB can be made sufficiently small that it fits easily inside the waveguide body.

FIG. 4 is an isometric view of a waveguide, taken apart, and a PCB with the power detection circuit. In this illustration, the waveguide is produced when the two semi-circular members 101a and 101b are joined. The material these members are made out of is suitable for microwave applications and is therefore suitable for producing the waveguide. When joined, the two members form a cylinder with a duct which, in this case, has a rectangular cross section and is substantially aligned with the axis of the cylinder. The length of the cylinder determines the length of the duct and, in turn, the length of the waveguide (as necessary for the particular frequency band). The shape and dimensions of the duct define the walls of the waveguide and particularly the top, bottom, input and load planes 102a–d. The bottom plane 102b has two notches that define the slots 104a and 104b through which the probes 106a and 106b can protrude into the waveguide. Being smaller than the length of the waveguide, the distance between the slots, and in turn the probes, is set to a quarter wavelength (90°) which varies with the transmission frequency band. One or both members accommodate the PCB and the slots. Specifically, one or both members 101 and 101b have a detector notch extending below the bottom plane (not shown) for fitting the PCB with the power detection circuitry between them when the members are joined such that the probes are allowed to protrude through the slots sufficiently to produce the desired sensitivity. Moreover, the notches that define the slots 104a and 104b in the bottom plane 102b are carved out of one or both members, depending on whether the detector notch is provided in one or both members.

As mentioned before, the detector circuitry is mounted on the PCB and because the circuit components are small the PCB dimensions can be small as well. What changes with frequency is the waveguide dimensions and the distance between the probes and the slots. The frequency change requires very simple redesign of the PCB layout and mechanical dimensions of the members that produce the waveguide. Therefore, this configuration is easy to manufacture in commercial applications and the results are easily repeatable.

In sum, the present invention provides ways in which reliable power detection and control can be achieved despite variations in load conditions; and the mechanical-electrical configuration of the power detection system is relatively simple and less costly to produce. Thus, although the present invention has been described in considerable detail with reference to certain preferred versions thereof, other versions are possible. In other words, the spirit and scope of the appended claims should not be limited to the description of the preferred versions contained herein.

What is claimed is:

1. A device for power detection, comprising:
   a waveguide for transporting forward and reflected waves of a signal with a corresponding wavelength and a power level, the waveguide having a pair of slots spaced apart by a quarter of the wavelength;
   a pair of probes protruding into the waveguide through the pair of slots for probing the signal and measuring its power level;
   a quarter wavelength delay component;
   a power combiner;
   a detector diode; and
   a carrier on which the pair of probes, quarter wavelength delay component, power combiner and detector diode are laid out in a configuration where the forward waves converge at the power combiner constructively and the reflected waves converge at the power combiner destructively, whereby the measured power level is substantially independent from load condition variations.

2. The device of claim 1, wherein the carrier is a printed circuit board or a substrate.

3. The device of claim 1, wherein the configuration is one in which the detector diode is connected to the power combiner for receiving a signal proportionate to the measured power level and in which the power combiner is connected to the pair of probes, one side of the power combiner being connected to one probe of the pair of probes via the quarter wavelength delay component.

4. The device of claim 1, wherein the waveguide has top, bottom, input and load planes, wherein the pair of slots is located in the bottom plane such that one of the slots and, in turn, one of the probes, are closer to the input plane.

5. The device of claim 4, wherein the configuration is one in which the detector diode is connected to the power combiner for receiving a signal proportionate to the measured power level and in which the power combiner is connected to the pair of probes, one side of the power combiner being connected via the quarter wavelength delay component to the probe which is closer to the input plane.

6. The device of claim 4, wherein the waveguide has a rectangular cross section.

7. The device of claim 1, wherein the pair of probes is conductive traces or strips.

8. The device of claim 1, wherein the power combiner is a resistive connection.

9. A device for power detection, comprising:
a pair of members detachably joined to form a body with a duct, wherein the duct defines a waveguide for transporting forward and reflected waves of a signal with a corresponding wavelength and a power level, the waveguide having a pair of slots spaced apart by a quarter of the wavelength; and
a detector circuit carrier inserted between the joined pair of members and fitting removably therebetween, the detector circuit carrier having a pair of probes, a quarter wavelength delay component, a power combiner, and a detector diode,
wherein the pair of probes protrudes into the waveguide through the pair of slots for probing the signal and measuring its power level, and
wherein the pair of probes, quarter wavelength delay component, power combiner and detector diode are laid out on the detector circuit carrier in a configuration where the forward waves converge at the power combiner constructively and the reflected waves converge at the power combiner destructively, whereby the measured power level is substantially independent from load condition variations.

10. The device of claim 9, wherein the detector circuit carrier is a printed circuit board or a substrate.

11. The device of claim 9, wherein the configuration is one in which the detector diode is connected to the power combiner for receiving a signal proportionate to the measured power level and in which the power combiner is connected to the pair of probes, one side of the power combiner being connected to one probe of the pair of probes via the quarter wavelength delay component.

12. The device of claim 9, wherein the waveguide has top, bottom, input and load planes, wherein the pair of slots is located in the bottom plane such that one of the slots and, in turn, one of the probes, are closer to the input plane.

13. The device of claim 12, wherein the configuration is one in which the detector diode is connected to the power combiner for receiving a signal proportionate to the measured power level and in which the power combiner is connected to the pair of probes, one side of the power combiner being connected via the quarter wavelength delay component to the probe which is closer to the input plane.

14. The device of claim 12, wherein the waveguide has a rectangular cross section.

15. The device of claim 9, wherein the body is a cylinder and the duct is substantially aligned with the axis of the cylinder.

16. The device of claim 9, wherein the pair of probes is conductive traces or strips.

17. The device of claim 9, wherein the power combiner is a resistive connection.

18. A power detection and control loop in a transmission system, comprising:
a waveguide inserted between an output stage and a load of a transmission system, the output stage producing a signal with a corresponding wavelength and a power level and the waveguide transporting forward and reflected waves of the signal, the waveguide having a pair of slots spaced apart by a quarter of the wavelength;
a detector circuit for measuring the power level of the signal, the detector circuit being laid out on a circuit carrier and having a pair of probes, a quarter wavelength delay component, a power combiner, and a detector diode, wherein the pair of probes protrudes into the waveguide through the pair of slots for probing the signal and measuring its power level, and
wherein the pair of probes, quarter wavelength delay component, power combiner and detector diode are laid out on a detector circuit carrier in a configuration where the forward waves converge at the power combiner constructively and the reflected waves converge at the power combiner destructively, whereby the measured power level is substantially independent from load condition variations; and
a control circuit having a buffer amplifier linked to stages responsive to the measured power level and operatively linked to the output stage for controlling its gain and, in turn, the power level of the signal.

19. A power detection and control loop in a transmission system as in claim 18, wherein the buffer amplifier provides a buffer between the detector diode and the stages.

20. A power detection and control loop in a transmission system as in claim 18, wherein the load is an antenna or a dummy load in a test device.

21. A power detection and control loop in a transmission system as in claim 18, wherein the circuit carrier is a printed circuit board or a substrate.

22. A power detection and control loop in a transmission system as in claim 18, wherein the configuration is one in which the detector diode is connected to the power combiner for receiving a signal proportionate to the measured power level and in which the power combiner is connected to the pair of probes, one side of the power combiner being connected to one probe of the pair of probes via the quarter wavelength delay component.

23. A power detection and control loop in a transmission system as in claim 18, wherein the waveguide has top, bottom, input and load planes, wherein the pair of slots is located in the bottom plane such that one of the slots and, in turn, one of the probes, are closer to the input plane which is facing the output stage.

24. A power detection and control loop in a transmission system as in claim 23, wherein the configuration is one in which the detector diode is connected to the power combiner for receiving a signal proportionate to the measured power level and in which the power combiner is connected to the pair of probes, one side of the power combiner being connected via the quarter wavelength delay component to the probe which is closer to the input plane.

25. A power detection and control loop in a transmission system as in claim 23, wherein the waveguide has a rectangular cross section.

26. A power detection and control loop in a transmission system as in claim 18, wherein the pair of probes is conductive traces or strips.

27. A power detection and control loop in a transmission system as in claim 18, wherein the power combiner is a resistive connection.

* * * * *